United States Patent [19]
Lam

[11] Patent Number: 6,040,218
[45] Date of Patent: Mar. 21, 2000

[54] TWO SQUARE NVRAM CELL

[75] Inventor: Chung H. Lam, Williston, Vt.

[73] Assignee: International Business Machines Corporation, Armonk, N.Y.

[21] Appl. No.: 09/394,093

[22] Filed: Sep. 13, 1999

Related U.S. Application Data

[62] Division of application No. 09/100,729, Jun. 19, 1998.

[51] Int. Cl.$^7$ .................................................. H01L 21/8247
[52] U.S. Cl. ............................ 438/259; 438/270; 438/589
[58] Field of Search .................................... 438/259, 270, 438/589

[56] References Cited

U.S. PATENT DOCUMENTS

| | | | |
|---|---|---|---|
| 5,196,722 | 3/1993 | Bergendahl et al. | 257/304 |
| 5,399,516 | 3/1995 | Bergendahl et al. | 437/43 |
| 5,467,305 | 11/1995 | Bertin et al. | 365/149 |
| 5,510,630 | 4/1996 | Agarwarl et al. | 257/296 |
| 5,656,544 | 8/1997 | Bergendahl et al. | 438/589 |
| 5,780,341 | 7/1998 | Ogura | 438/259 |
| 5,930,619 | 7/1999 | Noble | 438/259 |

*Primary Examiner*—Trong Phan
*Attorney, Agent, or Firm*—Whitham, Curtis & Whitham; Eugene I. Shkurko

[57] ABSTRACT

A non-volatile random access memory (NVRAM) cell and method of fabrication thereof. Pairs of NVRAM cells, each including three FETs stacked in a NAND-like structure are formed vertically in silicon pillars. Source devices at the bottom of the pillar selectively provide ground to one of the cells. A floating gate extends upward from the source device's gate line. A control gate plate extending between adjacent pillars selectively provides a programming voltage to the control gate. Both the source gate and the control gate are capacitively coupled through silicon rich oxide to the floating gate. Polysilicon plugs between silicon pillars are word line gates for cells in adjacent pillars. A diffusion at the top of each pillar is a bit line contact for both cells at the pillar. Each pair of cells on a pillar are on a common bit line and a common word line. The word line, control gate and source gate line select individual cells in the pair.

9 Claims, 14 Drawing Sheets

TWO SQUARE NVRAM CELL

RELATED APPLICATION

This application is a division of Ser. No. 09/100,729 filed on Jun. 19, 1998.

The present invention is related to U.S. patent application Ser. No. 09/224,827 (Attorney Docket No. BU9-98-017) entitled "NVRAM Array Architecture Utilizing Common Bitline And Wordline" to Chung H. Lam, assigned to the assignee of the present application.

BACKGROUND OF THE INVENTION

1. Field of the Invention

The present invention generally relates to non-volatile memory cells and more particularly to a three-dimensional, direct-write non-volatile random access memory (NVRAM) cell having a high integration density and methods fabrication therefor.

2. Background Description

Non-volatile floating gate memory cells, such as in a non-volatile random access memory (NVRAM) arrays are well known in the industry. In NVRAM cells, the cell's conductive state is determined by the charge state of the cell's floating gate. The floating gate is an electrically isolated gate of a field effect transistor (FET) stacked in a two device NAND-like structure. Charge is forced onto or removed from the floating gate through a thin insulator layer that, normally (during a read operation), isolates the gate electrically from other adjoining conductive layers. Typically, a negatively charged floating gate is representative of a binary one state, while an uncharged floating gate is representative of a binary zero state. The other device in the NAND-like structure provides for selective cell read and write selection.

For writing cells, a control gate (or program gate) is capacitively coupled to the floating gates in a portion of an array. A program voltage placed on a control gate biases the floating gate of cell connected to the control gate sufficiently to change the charge on the cell's floating gate, i.e. to write selected cells.

Normally, to write data into a prior art memory cell, the cell must first be erased and then written. Each of these operations may require one or more machine cycles, e.g., 10 milliseconds, and each requires a significantly higher external voltage supply, such as 8–20 volts. Special decoder circuits are used to provide these higher than normal voltages to the cells.

It is a normal design goal to minimize cell size, thereby maximizing cell density. However, memory designers have not achieved a state of the art unit cell that is smaller than 6–8 squares, where a square is the smallest unit design area for a given technology, e.g., 0.2 $\mu$m×0.2 $\mu$m. Any device fabrication technique improvements that produce a denser memory array and reduce chip power requirements.

Thus, there is a need for smaller, denser NVRAM cells.

SUMMARY OF THE INVENTION

It is therefore a purpose of the present invention to reduce NVRAM cell size.

It is another purpose of the present invention to increase the number of NVRAM cells that may be included on a single integrated circuit chip.

The present invention is a non-volatile random access memory (NVRAM) cell and method of fabrication thereof. Pairs of NVRAM cells, each including three FETs stacked in a NAND-like structure are formed vertically in silicon pillars. Source devices at the bottom of the pillar selectively provide ground to one of the cells. A floating gate extends upward from the source device's gate line. A control gate plate extending between adjacent pillars selectively provides a programming voltage to the control gate. Both the source gate and the control gate are capacitively coupled through silicon rich oxide to the floating gate. Polysilicon plugs between silicon pillars are word line gates for cells in adjacent pillars. A diffusion at the top of each pillar is a bit line contact for both cells at the pillar. Each pair of cells on a pillar are on a common bit line and a common word line. The word line and control gate or source gate line individually select cells in each pair.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
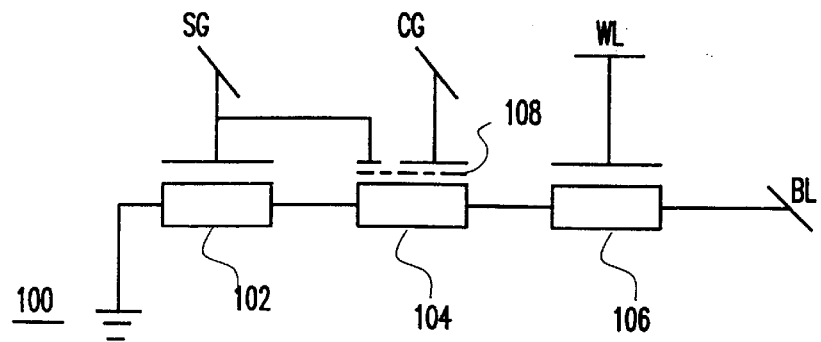
FIG. 1A shows a schematic of a preferred non-volatile random access memory (NVRAM) cell.

Referring now to the drawings, and more particularly to FIG. 1A which shows a schematic of a preferred non-volatile random access memory (NVRAM) cell 100. Three FETs 102, 104 and 106 are stacked in a NAND-like structure. Source device 102, which is connected between ground and floating gate device 104, has its gate tied to a source gate (SG) line. Word line select device 106 is connected between a bit line (BL) and floating gate device 104 and has its gate tied to a passing word line (WL). Control gate (CG) line and SG are capacitively coupled to the floating gate (represented by dashed line 108) of each floating gate device 104.

Figure 1C:
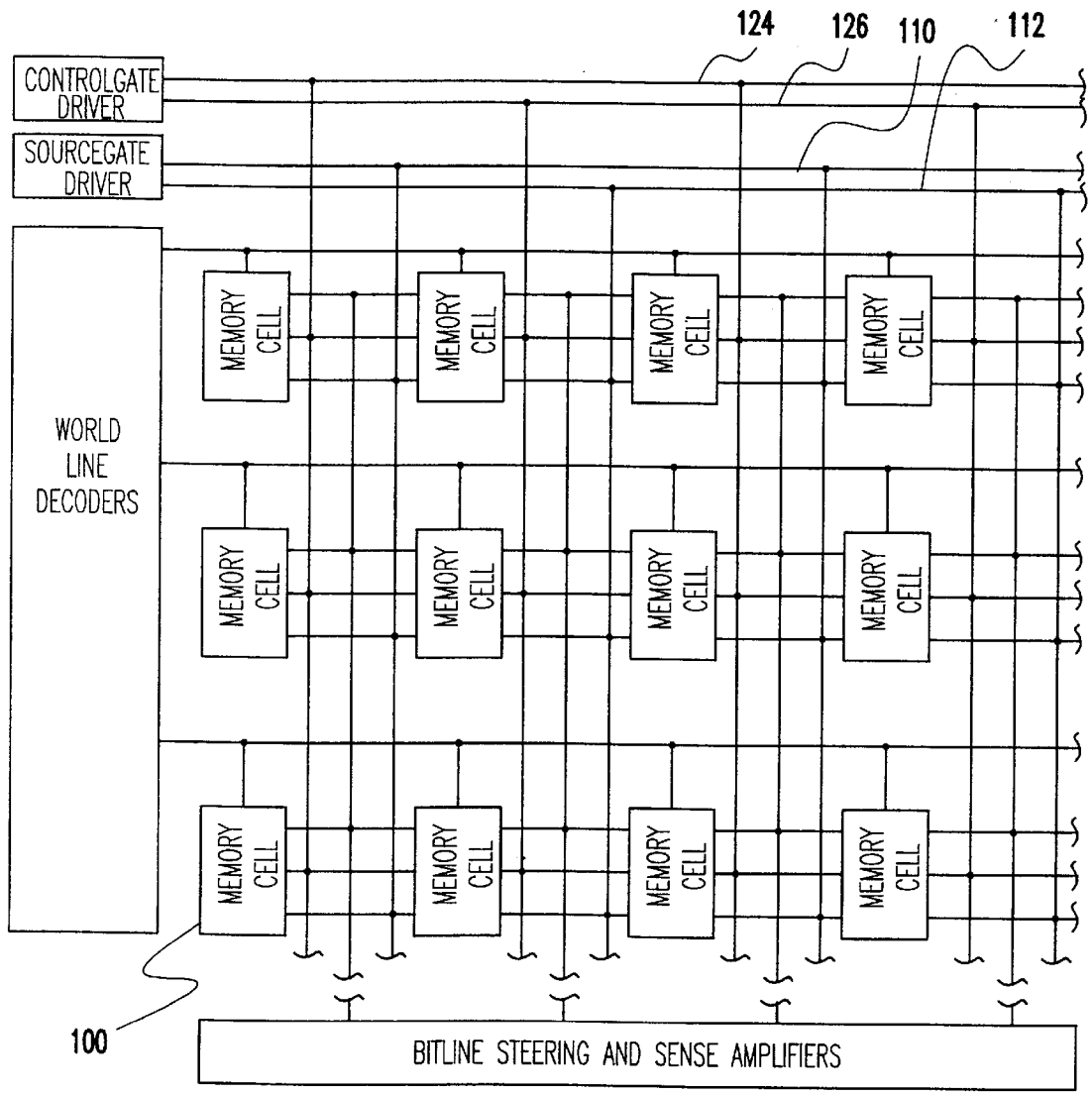
FIG. 1C is a schematic of sub-array organization and cell decode for a sub-array of preferred embodiment NVRAM cells.
Figure 1B:
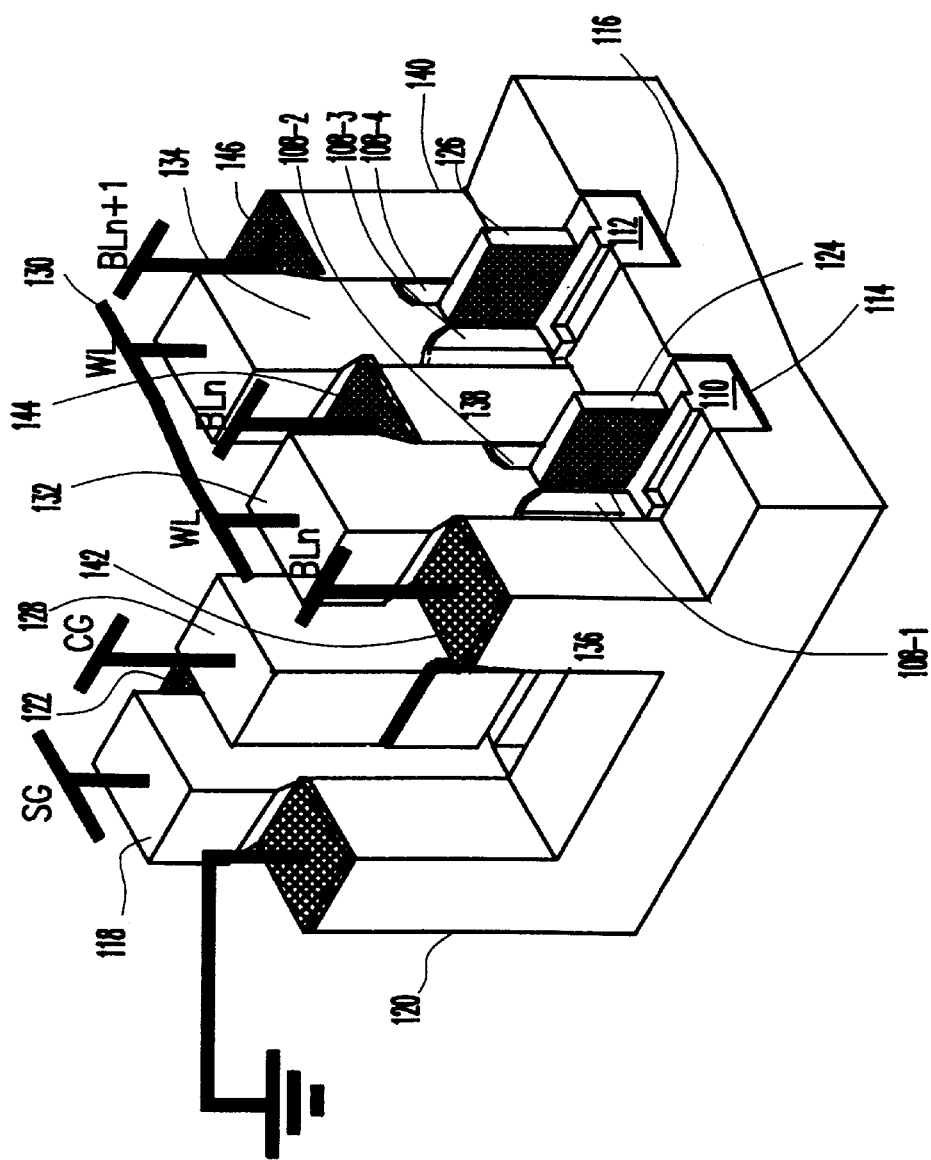
FIG. 1B shows is a cross-sectional view of a portion of a portion preferred embodiment array of cells of FIG. 1A.

As can be seen from FIG. 1B, which is a cross-sectional view of a portion of a preferred embodiment array, unlike prior art NVRAM cells, adjacent pairs of preferred NVRAM cells 100 share a common wordline (WL) and a common bitline (BL). In FIG. 1B, source gate lines 110 and 112 each extend along the bottom of a trench 114 and 116, respectively. Each source gate line 110 and 112 is driven from one end by a source gate contact pillar 118 (only source gate pillar 118 connected to source gate device 110 is shown in FIG. 1B).

A diffusion (not shown) along the bottom of each trench 114, 116 is the source diffusion of each source device 102 along the trench 114, 116. Ground is supplied to the diffusion through sidewall FETs in pillars 120, 122 gated on opposite sides of adjacent source gate contact pillars 118.

Planar control gate lines 124, 126 are collinear with and immediately above source gate lines 110, 112, respectively.

Each control gate line 124, 126 is coupled to a pair of floating gates 108-1, 108-2 and 108-3, 108-4, respectively. As with the source gate lines 110 and 112, the planar control gate lines 124, 126 are driven from one end by control gate contact pillar 128.

For the preferred embodiment, each word line 130 is connected to word line plugs 132, 134. Each word line plug 132, 134 extends upwards between two pillars 136, 138 and 140, at least slightly overlaps of floating gate pairs 108-1, 108-2 and 108-3, 108-4, respectively. Thus, each word line plug 132, 134 is the gate of a pair of word line select devices 106. Bit line contacts 142, 144 and 146 at the top of each pillar 136, 138 and 140 are shared by pairs of adjacent cells, as represented in FIG. 1B, particularly, by pillar 138 and bit line contact 144.

During a read, each cell is selected, individually, by of the cell's word line 130 being high coincidentally with the cell's source gate line 110 or 112 being high. During a write, each cell is selected, individually, by the cell's word line 130 being high coincidentally with the cell's control gate line 124 or 126 being high. The table below is an example of voltages on the terminals of a preferred embodiment NVRAM cell during READ and WRITE operations.

Thus, when control gate 110 is high and word line 130 is driven high, data from the cells represented by floating gate pair 108-1 and 108-2 is provided to bit lines 142 and 144, respectively. Alternately, when control gate 112 is high and word line 130 is driven high, data from the cells represented by floating gate pair 108-3 and 108-4 is provided to bit lines 144 and 146, respectively. A write may be done without first erasing the cell.

|  | READ | WRITE |
|---|---|---|
| Bit line | 1V | "0" = 0V |
|  |  | "1" = 3V |
| Word line | 3V | 3V |
| Control Gate | 0V | 12V |
| Source Gate | 3V | 0V |

Thus, the array of the preferred embodiment NVRAM chip includes multiple sub-arrays of rows and columns of cells. Each sub-array includes two control gates 124, 126 and two source gate lines 110, 112 as represented in the schematic of FIG. 1C. Only one of the two control gates 124, 126 are driven high in any one write operation and, only one of the two source gate lines 110, 112 are driven high in any one read operation. For optimum performance, another sub-array is accessed between accesses to cells on different control gates in any one sub-array. The preferred chip architecture for a preferred embodiment NVRAM is provided in U.S. patent application Ser. No. 09/224,827 (Attorney Docket No. BU9-98-017) entitled "NVRAM Array Architecture Utilizing Common Bitline And Wordline" to Chung H. Lam, assigned to the assignee of the present application and incorporated herein by reference.

Figure 2:
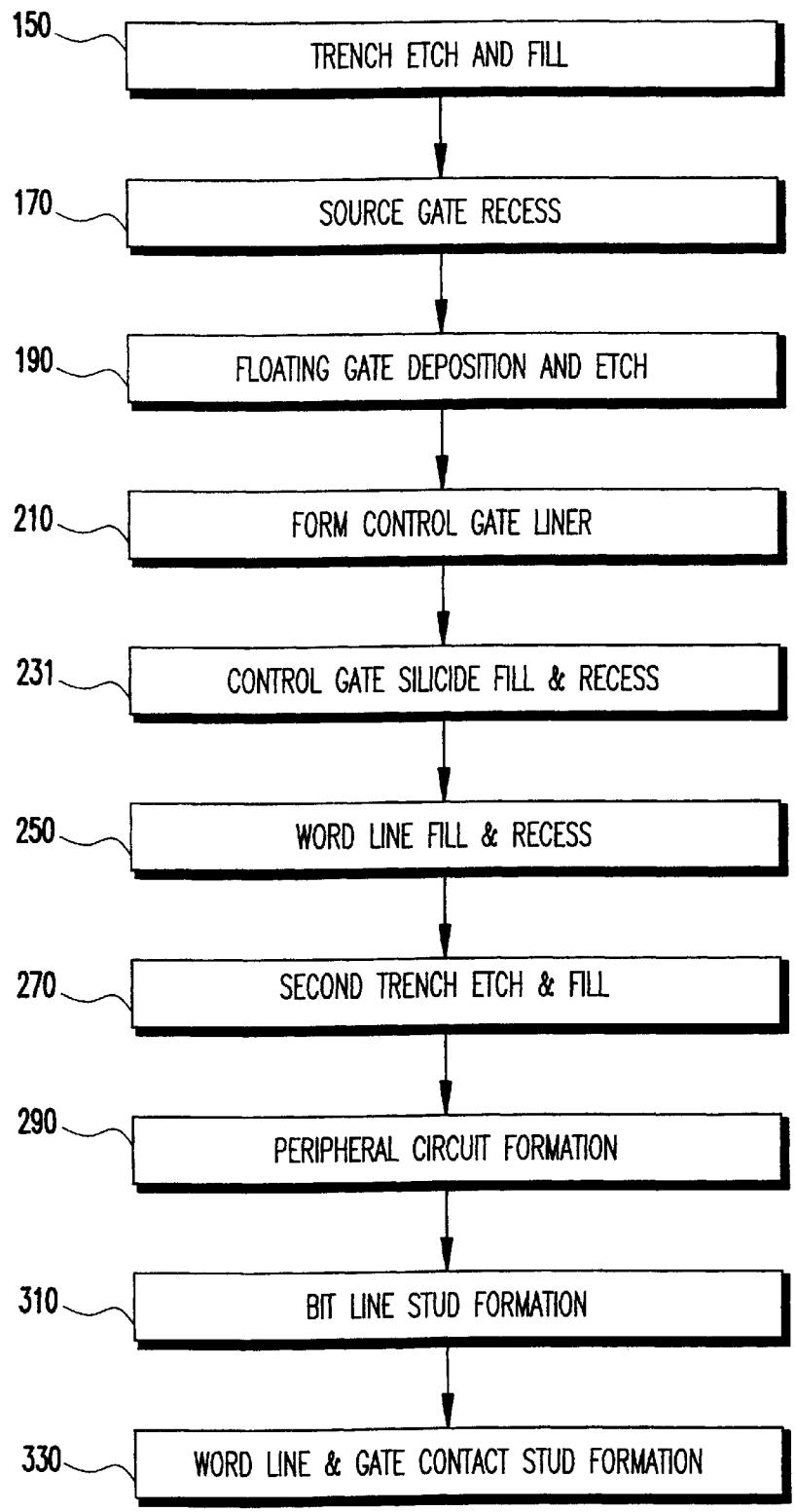
FIG. 2 is a flow diagram of the preferred embodiment method of forming a preferred embodiment NVRAM.
Figure 3:
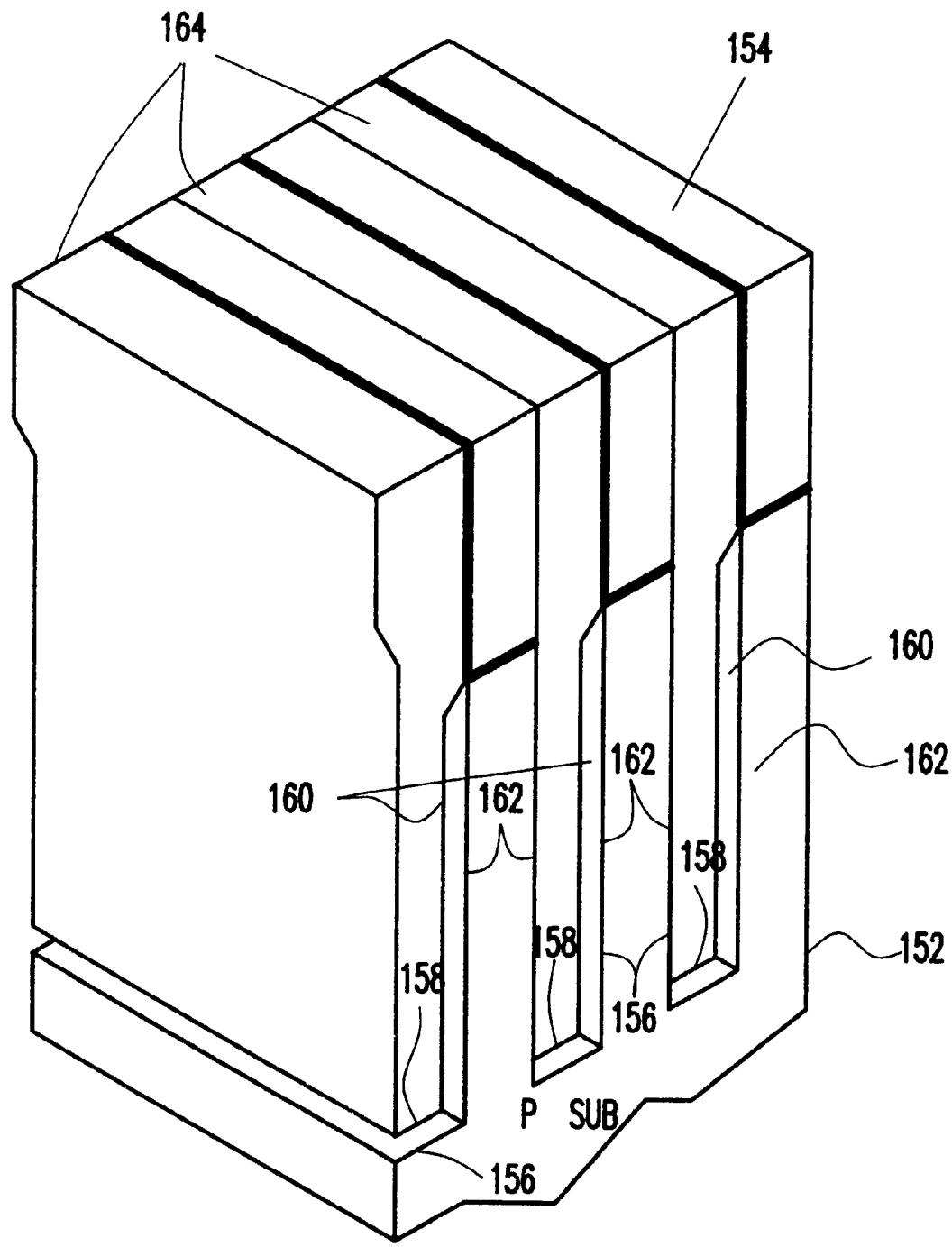
FIGS. 3–12 show a cross sections of a preferred embodiment array after completing each of the steps of FIG. 2.

FIG. 2 is a flow diagram of the preferred method of forming a preferred NVRAM. Thus, the first step 150, as shown in FIG. 3, begins on a silicon substrate layer 152, preferably a p-type field doped (p−) silicon wafer. After normal pad oxidation formation (not shown), pad nitride 154 formation and pad tetra-ethy-oxy-silane (TEOS) deposition (not shown), trenches 156 are formed in the wafer 152. The trenches 156 may be formed using any well known mask and etch step. N-type dopant is directionally implanted and diffused into the bottom surface 158 of the trenches 156. A thin gate oxide layer 160 is formed at on the trench sidewalls 162, forming the source device gate oxide. N-type polysilicon is deposited, filling the trenches with poly 164 for the source gate lines. Finally, excess polysilicon is removed from horizontal surfaces using, preferably, chemical mechanical polishing (CMP), although any suitable method may be used.

Figure 4:
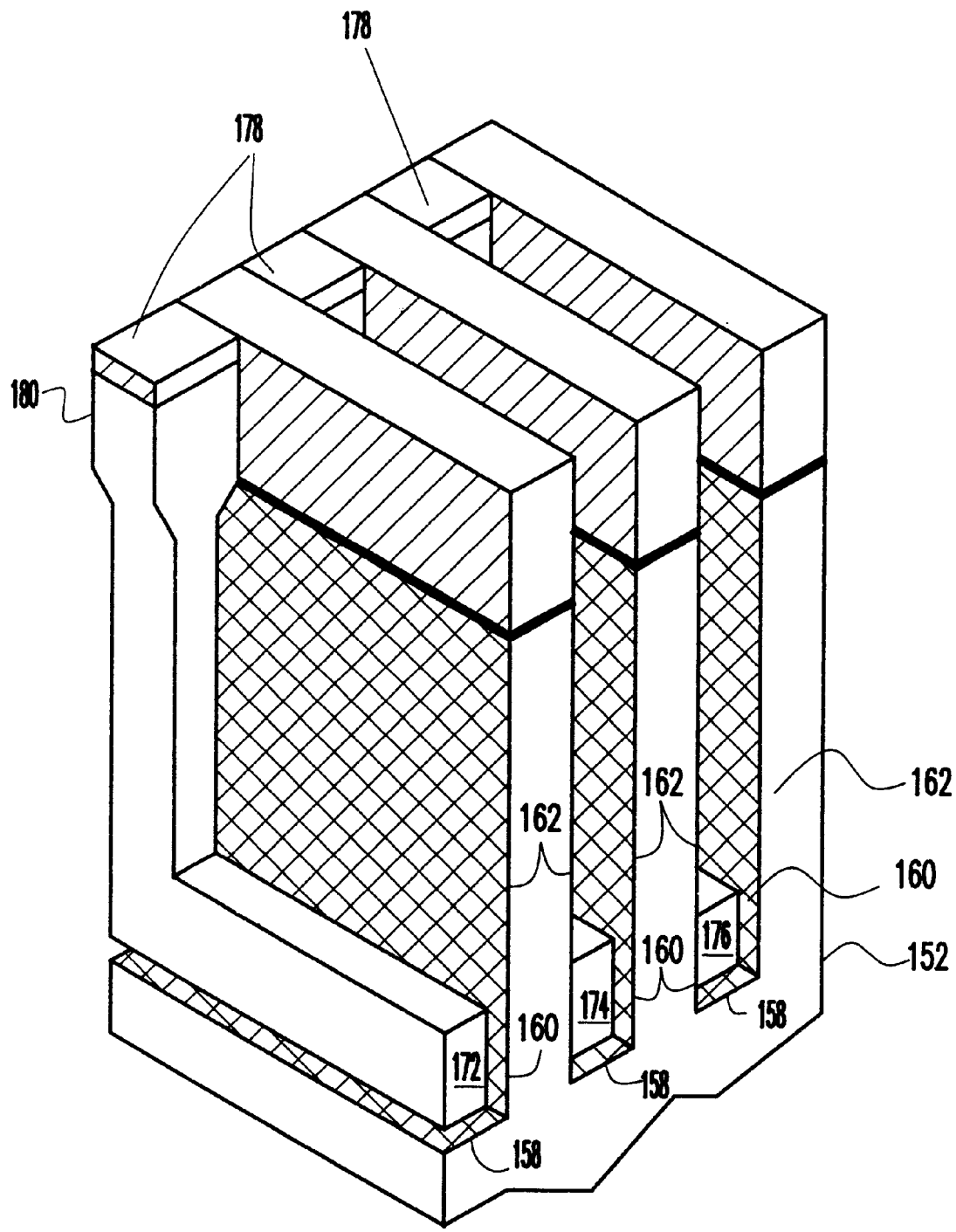

Next, in step 170 as shown in FIG. 4, poly 160 is masked and etched, recessing it into the trenches to form source gate lines 172, 174 and 176. First, the poly fill 164 is recessed below the remaining pad nitride 154. A capping layer 178 of TEOS is deposited on the recessed structure, which is then planarized, preferably using CMP. The capping layer is patterned using any well know resist and etch step to remove the TEOS capping layer 178 from the recessed poly fill 164. TEOS remains where source gate contact pillars (e.g. 118) are to be formed. Finally, in this step 170, the exposed portions of poly fill 164 are removed using a selective etch, leaving source gate lines 172, 174 and 176, each with a source gate contact pillar 180 at one end capped with the TEOS cap 178.

Figure 5:
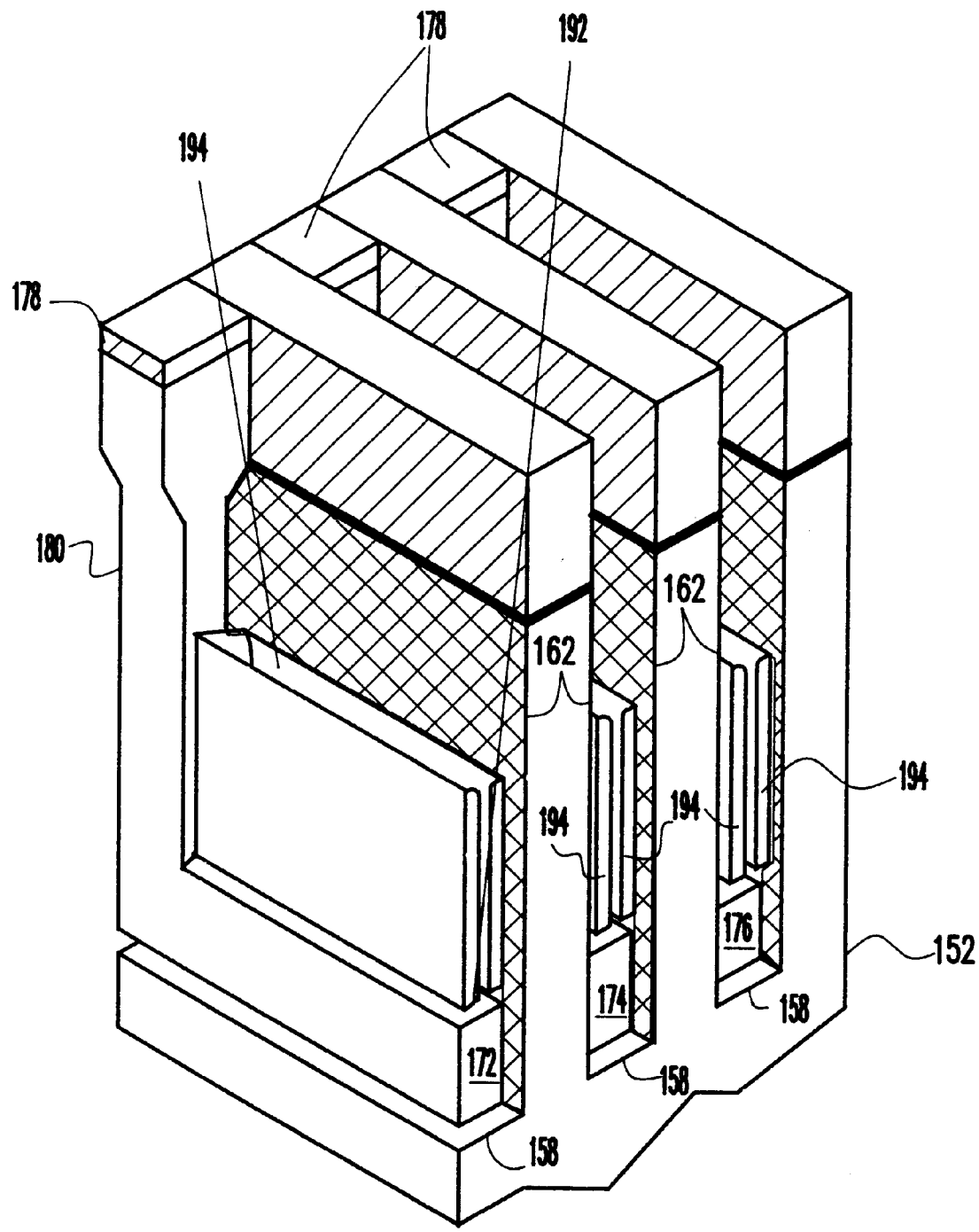

Next, in step 190, as shown in FIG. 5, floating gates 108 are formed. First, the structure of FIG. 4 is cleaned in a pre-clean step. Then, floating gate oxide is formed on the exposed trench silicon sidewalls. An initial conformal polysilicon layer, less than 10 nm is deposited, forming a Silicon (Si) buffer on the sidewalls of the trenches. After the forming the Si buffer, Si is implanted into the oxide to form a silicon rich floating gate oxide 192. The Si buffer blocks implanting Si, inadvertently, into the floating gate oxide. Although implanting Si into the oxide is preferred, other methods of forming silicon rich oxide, which are well known in the art, may be used. Having formed the silicon rich floating gate oxide, a thin conformal layer of polysilicon is deposited on the structure. The conformal poly layer is directionally etched, preferably using a reactive ion etch (RIE) to remove poly from horizontal. The RIE continues until the thin sheet of poly 194 remains along only a portion (where floating gates are intended) of the trench sidewalls 160.

Figure 6:
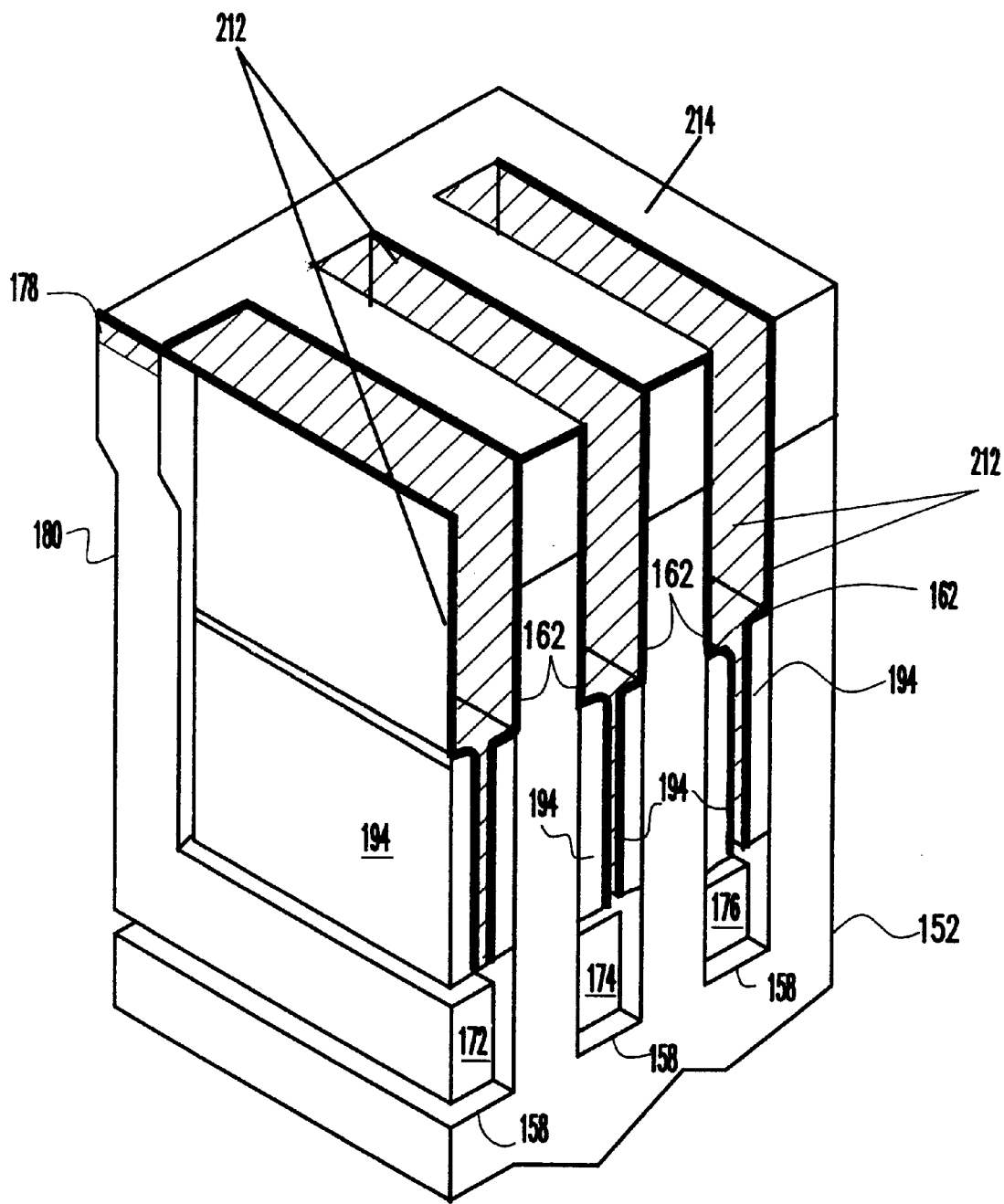

Next, in step 210, as shown in FIG. 6, a thin polysilicon liner 212 for the control gate is formed on the structure of FIG. 5. So, after a pre-clean to remove native oxide, silicon rich oxide is deposited, especially on the poly sheets 194. Then a thin 20–50 nm conformal poly liner layer 212, preferably of n-type polysilicon, is formed on the structure. A nitride spacer is deposited on the poly liner 212 and etched directionally to remove the nitride spacer from horizontal surfaces. Exposed poly liner is then oxidized, until it is consumed as oxide 214. Finally, the nitride space is stripped away, leaving the structure of FIG. 6.

Figure 7:
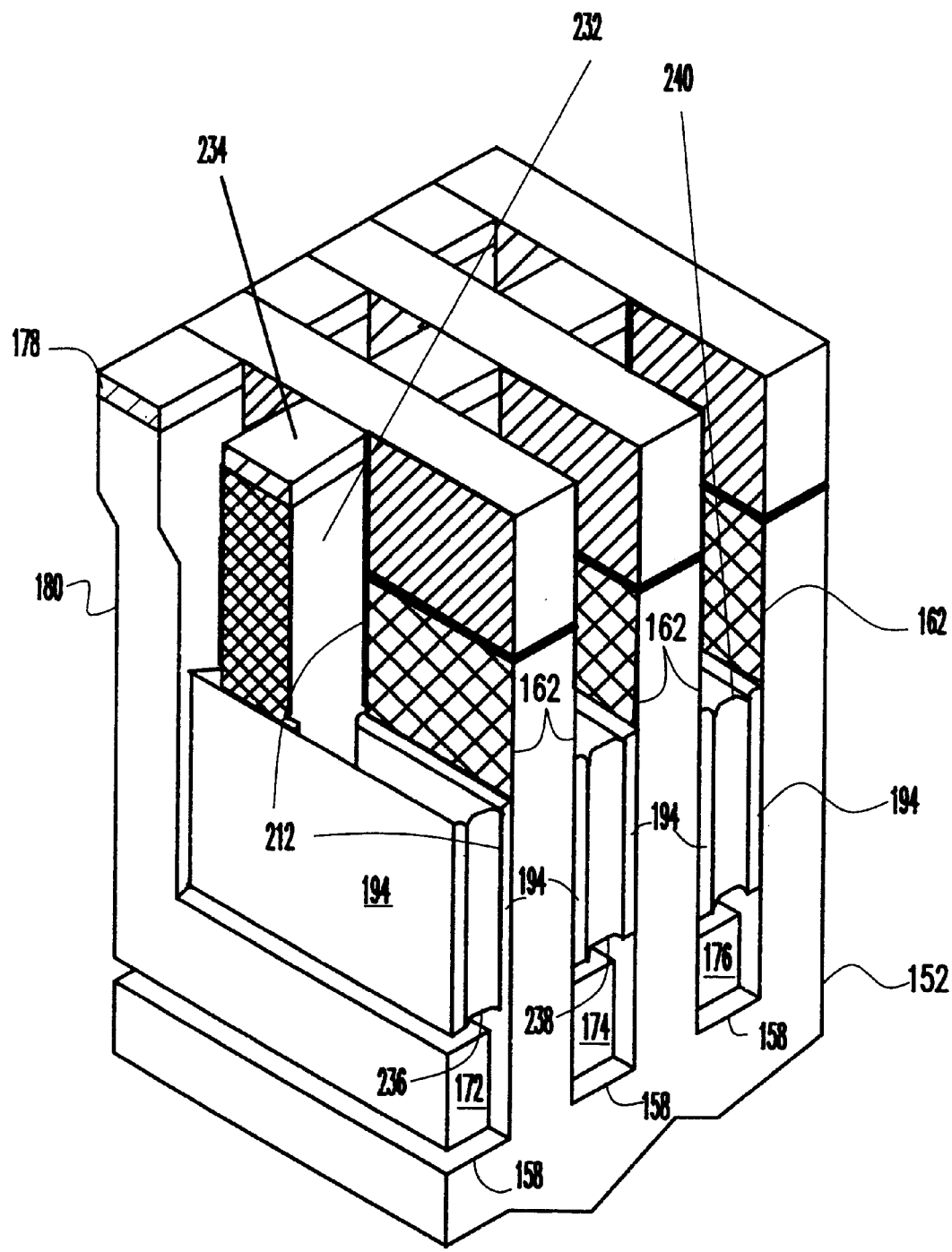

Next, in step 230, as shown in FIG. 7, the poly liner 212 of FIG. 6 is filled with silicide and recessed. Preferably, the silicide is $CoSi_x$, although $TiSi_x$ or $WSi_x$ may be substituted. So, after filling the poly liner 212 with silicide, as with source gate polysilicon in FIG. 4, the silicide and poly liner 212 are recessed, slightly, and a TEOS cap layer is deposited. The TEOS cap layer is partially removed when the surface is planarized, preferably using CMP. Then, the TEOS cap layer is patterned, removing the TEOS cap from the silicide filled poly liner except at the control gate contact pillar 232, which remains protected by a TEOS cap 234. Then, the exposed silicide filled poly liner 212 is recessed below the upper edge of the floating gate plates 194, thereby forming planar control gate lines 236, 238 and 240 sandwiched between remaining poly liner 212'.

Figure 8:
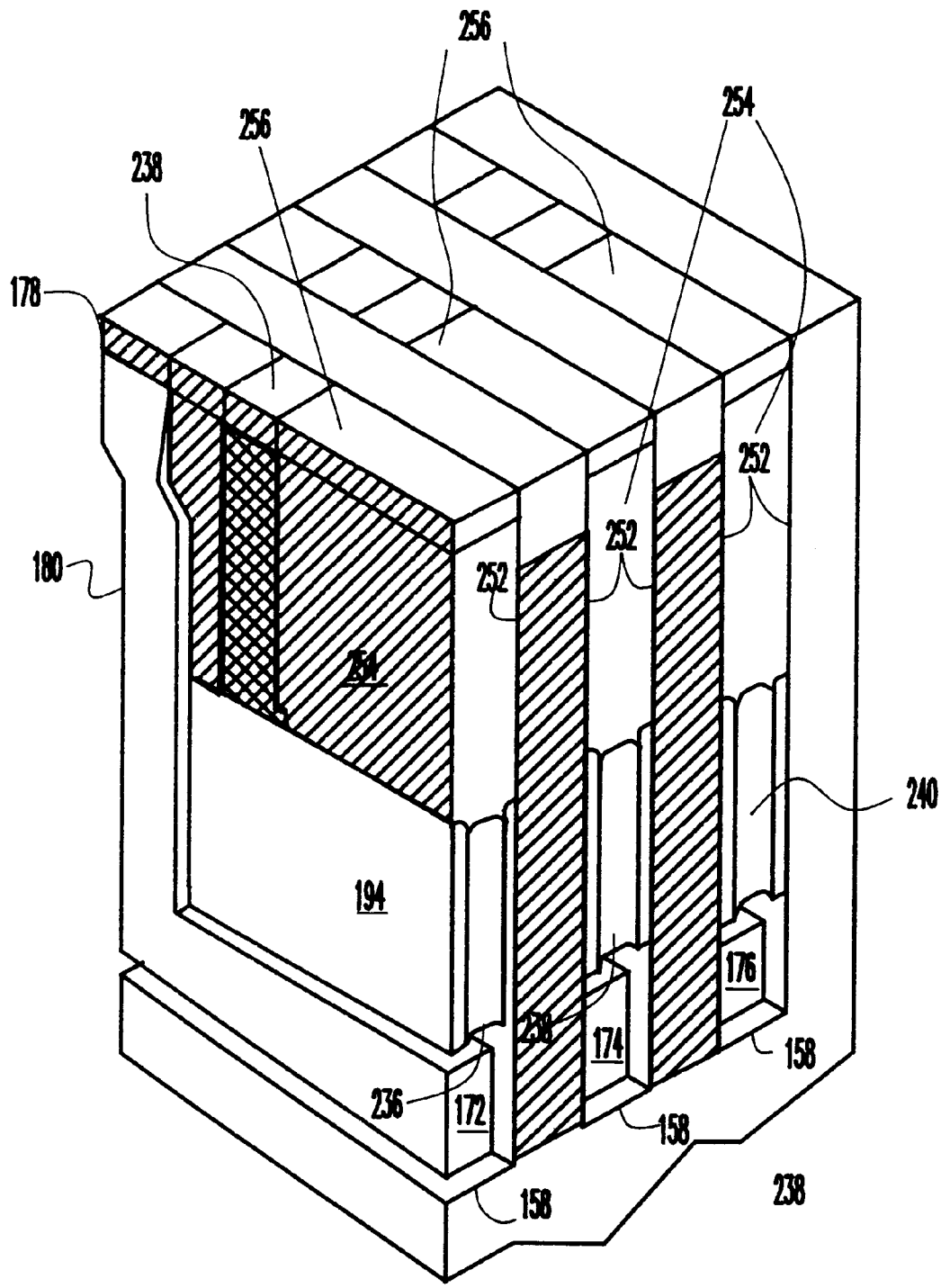

Next, in step 250, as shown in FIG. 8, the structure of FIG. 7 is filled with polysilicon for forming individual word lines.

After a preclean step to remove any native oxide, gate oxide is grown on the exposed trench sidewalls 160. Polysilicon 252, preferably n-type polysilicon, is deposited on the structure to fill the trenches 158. Excess polysilicon 252 is removed, preferably using CMP. Then, the word line polysilicon 252 remaining in the trenches 158 is recessed slightly and capped with a TEOS capping layer. Excess TEOS is removed, preferably using CMP, leaving TEOS capps 254 on word line polysilicon 252.

Figure 9:
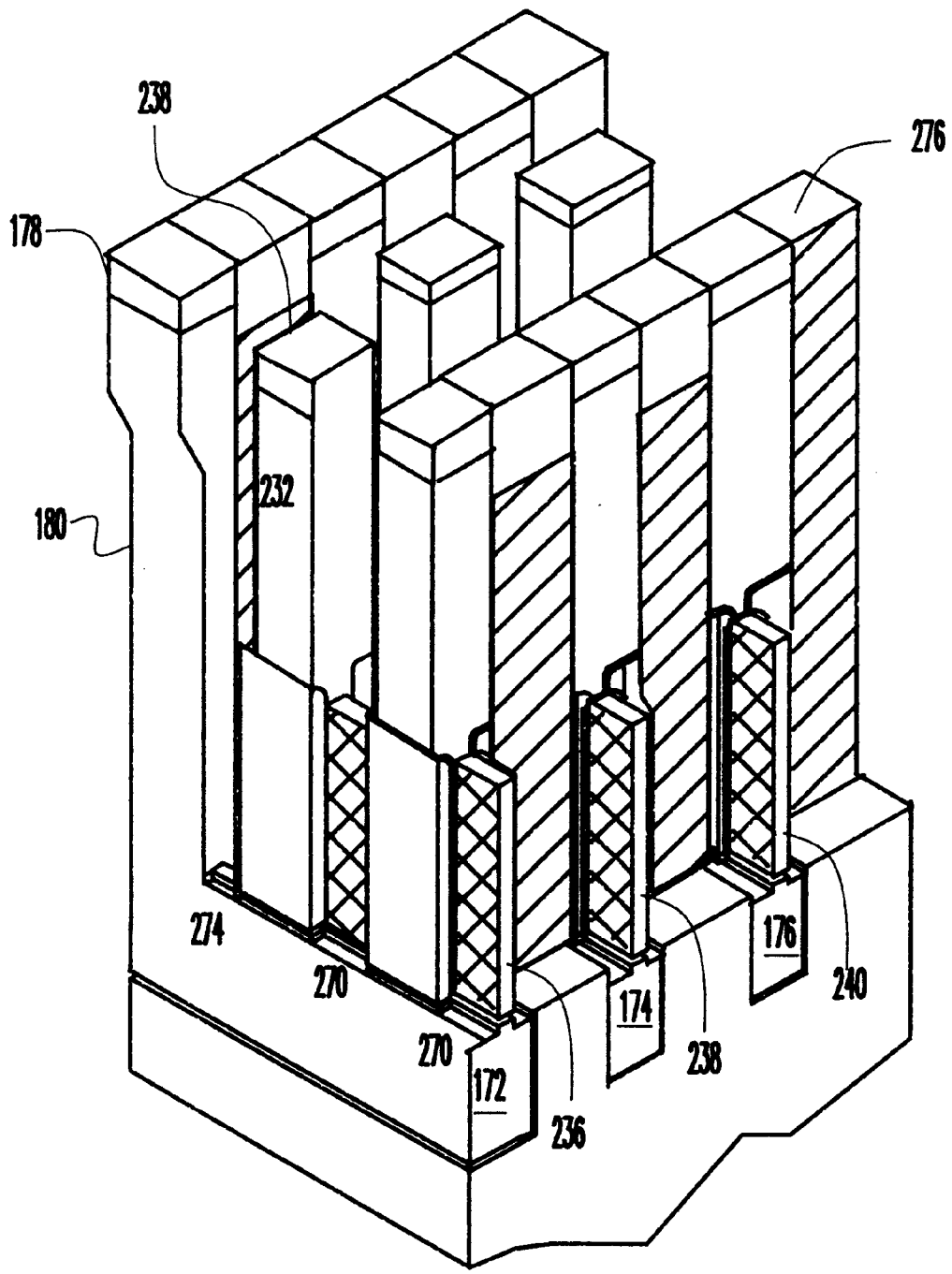

Next, in step 270, as shown in FIG. 9, the individual cells are defined by etching a second set of trenches 272, perpendicular to the first, into the structure of FIG. 8. Preferably, a directional RIE that is selective to silicide is used to etch through everything but silicide control gate lines 236, 238 and 240. Etching these second trenches continues until the upper surface of source gate lines 172, 174 and 176 is etched, slightly. The amount that the source gate lines 172, 174 and 176 are etched is unimportant, provided, however, that they are not removed completely.

Additionally, a trench 274 is etched between source gate pillars 180 and control gate contact pillars 232 and silicon is removed between individual control gate contact pillars 232, preferably by opening a single wide trench that spans the gate contact pillars 232 and both of the second trenches on either side of the gate contact pillars 232. After etching the second trenches, individual word lines 276 of the NVRAM array have been defined. Once the word lines 276 have been defined, the trenches 272, 274 in the structure of FIG. 9 are filled with TEOS (not shown) and the filled structure is replanarized and the array structure is, essentially, complete.

Figure 10:
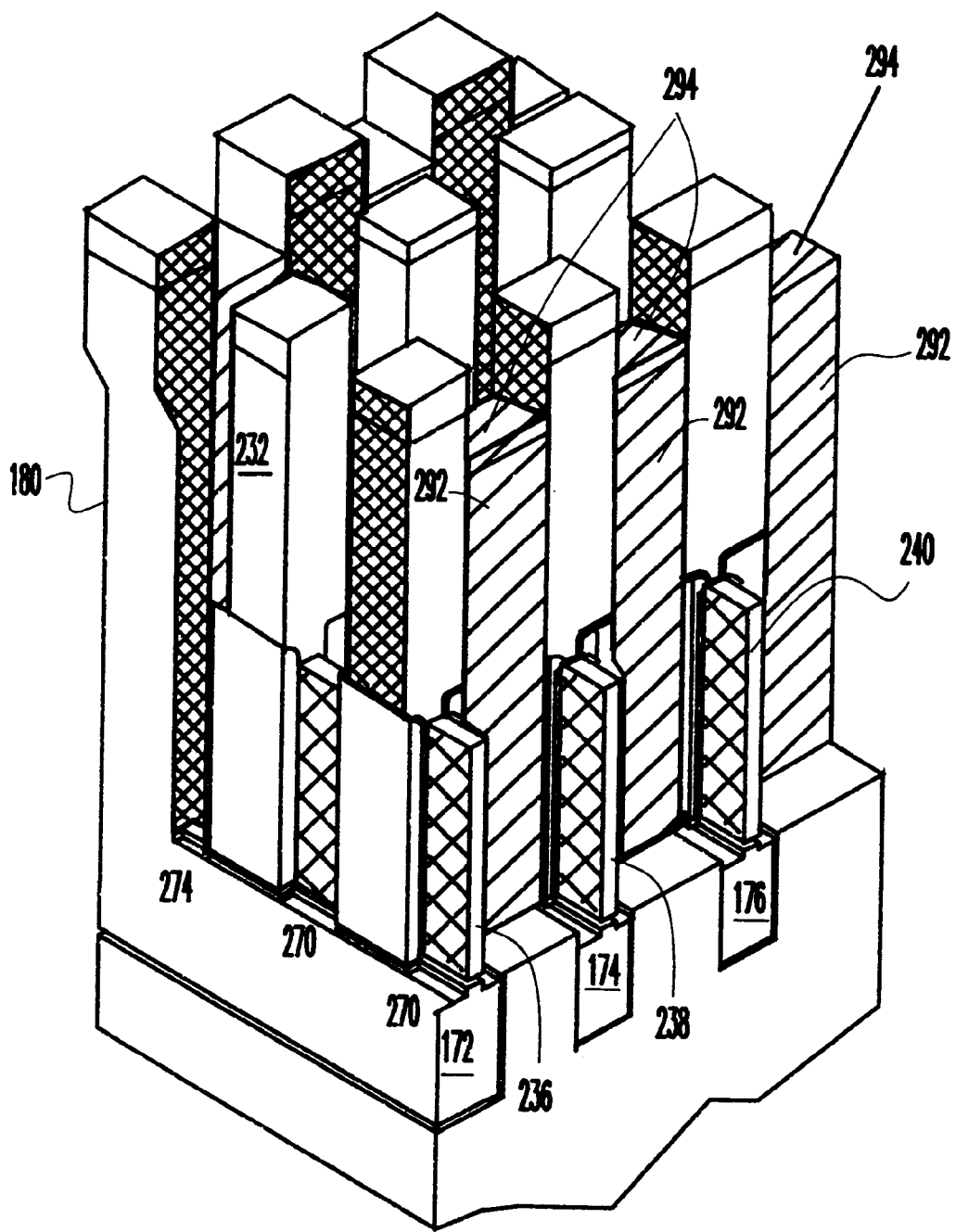

So, in step 290, chip processing continues, normally, defining devices for peripheral circuits such as sense amplifiers, decoders, receivers, off chip drivers and timing logic. As can be seen from FIG. 10, the array is untouched during this step, except to remove the remainder of nitride caps 154 and then, define bit line diffusions, implanting and diffusing n-type dopant into the p$^-$ silicon device pillars 292. Each bit line diffusion 294 forms a common drain of a pair of word line select devices 106. Then, the entire wafer surface, both peripheral circuits and array are passivated using Phosphosilica Glass (PSG).

Figure 11:
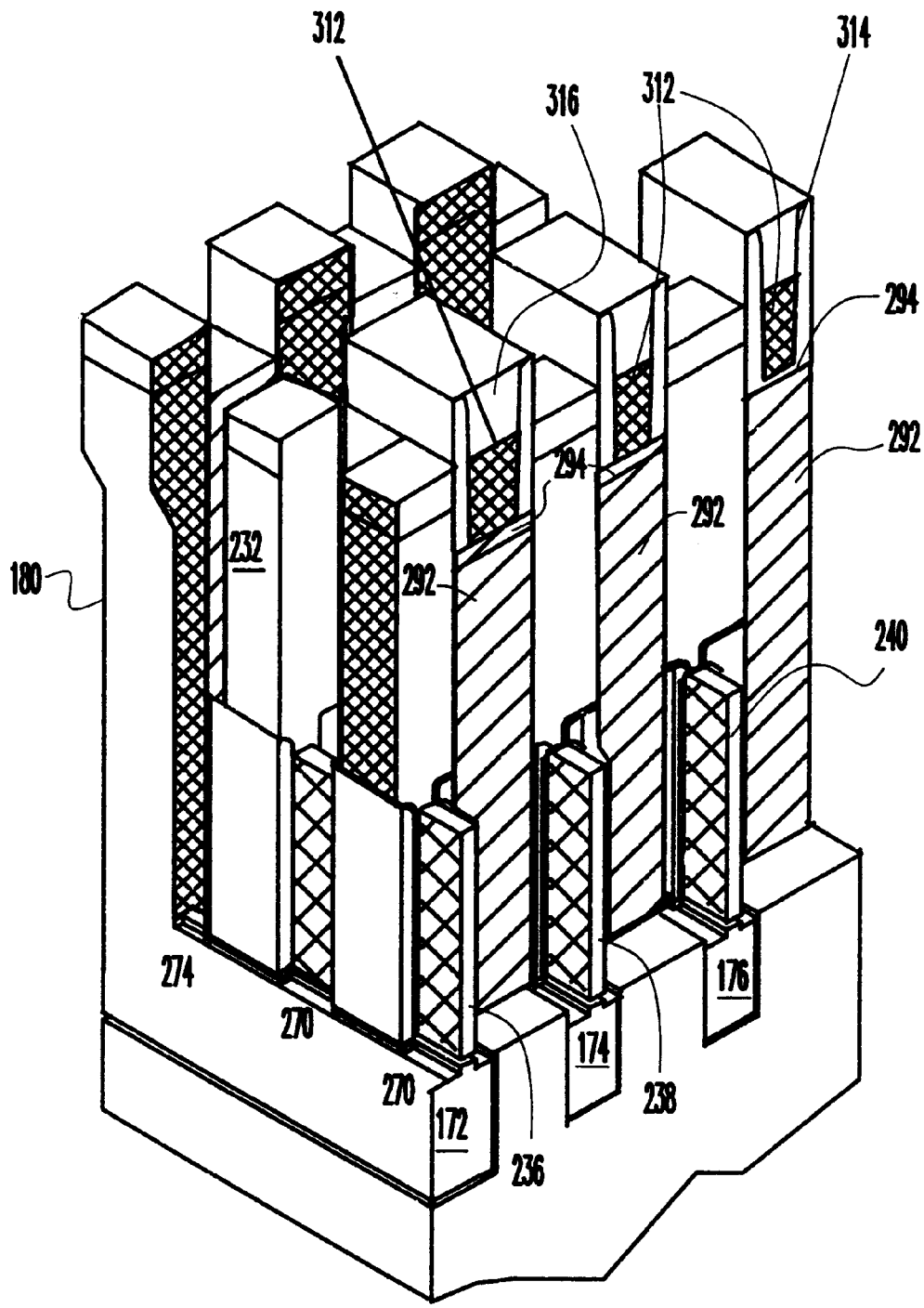

Next, in step 310, as shown in FIG. 11, bit line contact studs 312 are formed at the bit line diffusion 294 on p$^-$ silicon device pillars 292. First, the PSG is etched away at the bit line diffusions 294. Then, a conformal layer of nitride is deposited and directionally etched to leave nitride sidewalls 314. Nitride sidewalls 314 act as spacers between subsequently formed word line and bit line contacts. After a pre-clean to remove native oxide from the bit line diffusions 294, a thin titanium nitride (TiN) liner is deposited. Tungsten is deposited on the TiN liner. A preliminary etch removes the bulk of the deposited tungsten from the wafer surface. Then, any tungsten remaining on the surface is removed using CMP. Finally, nitride is deposited on the wafer sufficient to fill the nitride spacers 314. After planarizing the deposited nitride, nitride plugs 316 cap the bit line tungsten studs 312.

Figure 12:
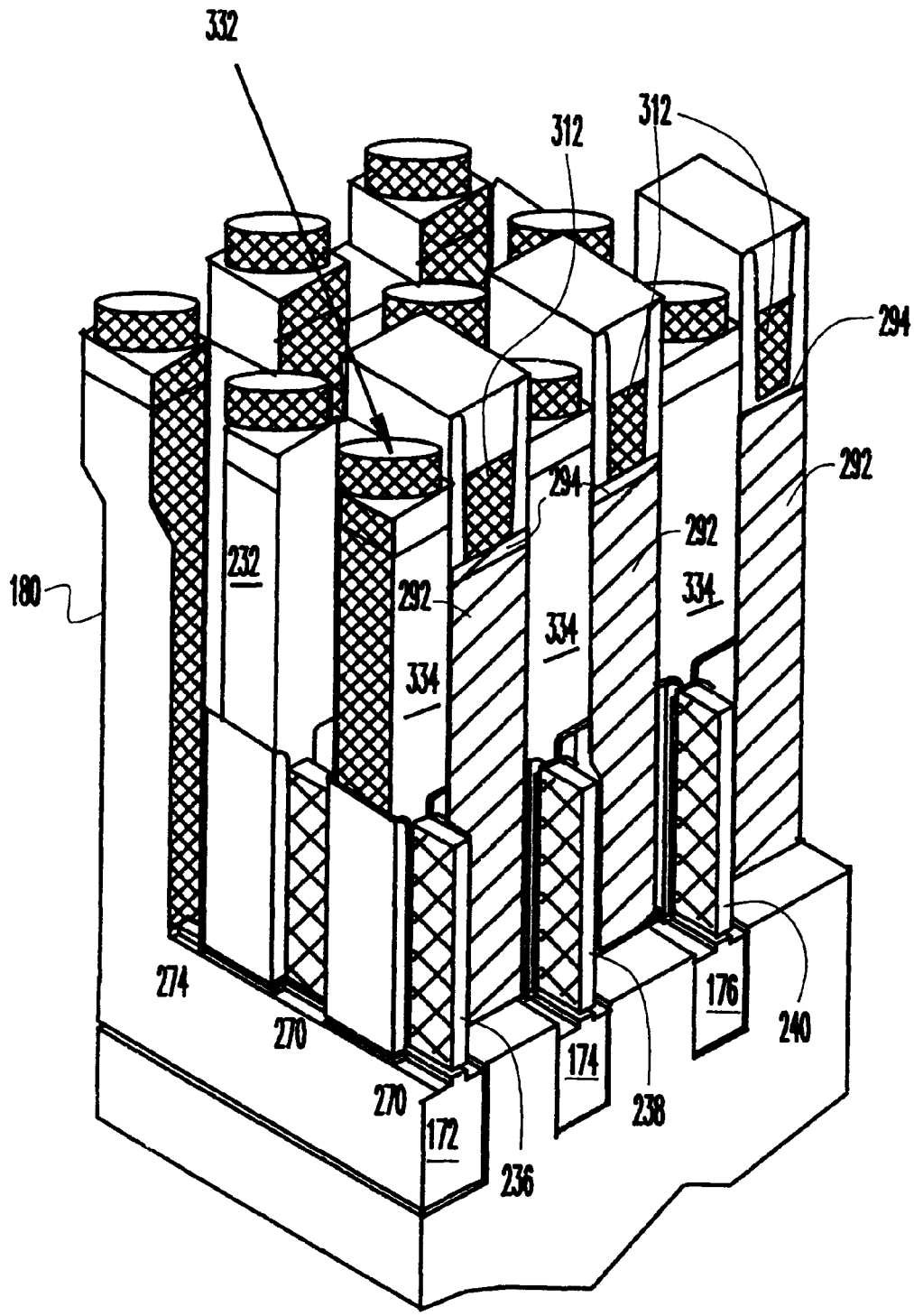

Next, in step 330, as shown in FIG. 12, contact studs 332 are formed at the word line plugs 332, source gate pillars 180 and control gate contact pillars 232. First the PSG is patterned to open contacts to the word line plugs 332, source gate pillars 180 and control gate contact pillars 232 using an etch that is selective to nitride. After a pre-clean to remove any native oxide, a thin conformal TiN liner is deposited and tungsten is deposited on the TiN liner. After a preliminary etch to remove the bulk of the deposited tungsten from the wafer surface, any tungsten remaining on the surface is removed using CMP, leaving tungsten studs 332.

Figure 13:
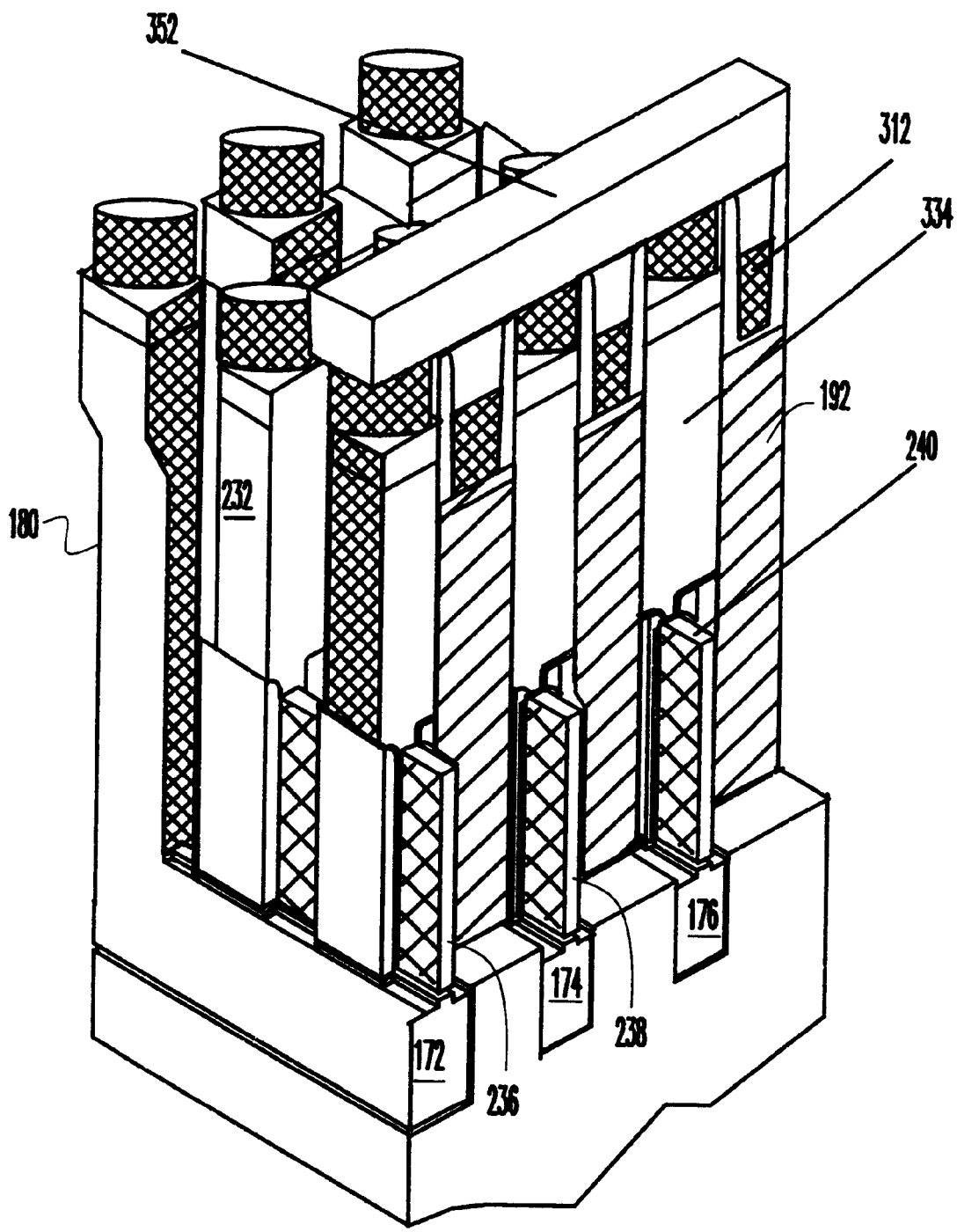
FIG. 13 shows the preferred embodiment cross section of FIGS. 3–12 after completing array formation and forming metal word lines.

Finally, metal word lines 352 in FIG. 13 are formed at each word line 352. Bit line contacts are formed with peripheral logic contacts and the wafer wiring is completed using appropriate semiconductor chip wiring steps.

While the invention has been described in terms of preferred embodiments, those skilled in the art will recognize that the invention can be practiced with modification within the spirit and scope of the appended claims.

I claim:

1. A method of forming an array of non-volatile random access memory (NVRAM) cells comprising the steps of:
    a) etching a plurality of trenches in a semiconductor layer;
    b) forming a source gate line of a first conductive material in said trenches;
    c) forming sidewalls of said first conductive material above said source gate line along the sidewalls of said trenches;
    d) forming a plate of a second conductive material between said first conductive material sidewalls;
    e) plugging said trenches above said plate with said first conductive material;
    f) forming perpendicular to said trenches a plurality of second trenches, said second trenches dividing said trenches such that semiconductor pillars are formed, said first conductive material sidewalls are divided into floating gates adjacent said semiconductor pillars and said first conductive material plugging said trenches is divided into word line plugs adjacent said semiconductor pillars.

2. The method of claim 1 wherein the step (b) of forming the source gate line comprises the steps of:
    1) implanting diffusion into the bottom of said trench;
    2) forming a gate oxide layer on the sidewalls of said trenches;
    3) filling said trenches with said first conductive material;
    4) etching said first conductive material from said trenches until a source gate line of said first conductive material remains in said trenches.

3. The method of claim 2, wherein the first conductive material is etched in the etching step (4) such that a pillar of said first conductive material remains extending above said semiconductor material in each said trench from said source gate line.

4. The method of claim 2, wherein the step (c) of forming first conductive material sidewalls comprises the steps of:
    1) forming an oxide layer on said source gate line and a gate oxide layer on the sidewalls of said trenches;
    2) depositing a first layer of said first conductive material;
    3) implanting said semiconductor material into said oxide layer;
    4) depositing a conformal layer of said first conductive material; and
    5) directionally etching said conformal layer along said sidewall below said semiconductor sidewalls.

5. The method of claim 2, wherein the step (d) of forming the second conductive material plate comprises the steps of:
    1) forming a thin conformal liner of said first conductive material;
    2) oxidizing horizontal portions of said thin conformal liner
    3) filling said liner with said second conductive material.

6. The method of claim 5, wherein the step (d) further comprises the steps of:
    4) etching said second conductive material and said thin conformal liner into said trenches below the top edge of said first material sidewalls.

7. The method of claim 6, wherein the second conductive material and thin first conductive material are etched in the etching step (4) such that a pillar of said second conductive material remains extending above said semiconductor material in each said trench from said second conductive material plate.

8. The method of claim 2, further comprising the steps of:
g) forming bit line diffusions at each pillar's top surface;
h) in each column, connecting all bit line diffusions together; and
i) in each row, connecting all word line plugs together.

9. The method of claim 2 wherein the semiconductor material is silicon, the first conductive material is polysilicon and the second conductive material is silicide.

* * * * *